(12) United States Patent
Reid et al.

(10) Patent No.: US 7,714,423 B2
(45) Date of Patent: May 11, 2010

(54) MID-PLANE ARRANGEMENT FOR COMPONENTS IN A COMPUTER SYSTEM

(75) Inventors: Gavin Reid, Campbell, CA (US); Ihab Ali, Cupertino, CA (US); Chris Ligtenberg, San Carlos, CA (US); Ron Hopkinson, Campbell, CA (US); David Hardell, San Jose, CA (US)

(73) Assignee: Apple Inc., Cupertino, CA (US)

( * ) Notice: Subject to any disclaimer, the term of this patent is extended or adjusted under 35 U.S.C. 154(b) by 707 days.

(21) Appl. No.: 11/239,879

(22) Filed: Sep. 30, 2005

(65) Prior Publication Data

US 2007/0075412 A1    Apr. 5, 2007

(51) Int. Cl.
*H01L 23/02* (2006.01)

(52) U.S. Cl. .............................. 257/686; 257/E23.004; 257/E23.105; 257/E25.012; 257/E23.084; 257/685; 257/777; 257/723; 257/737; 257/738; 257/778

(58) Field of Classification Search .................. 257/686, 257/685, E23.004, E23.105, E23.101, E23.084, 257/707, 723, 777, 738, 778, 737

See application file for complete search history.

(56) References Cited

U.S. PATENT DOCUMENTS

| | | | | |
|---|---|---|---|---|
| 6,442,026 | B2 * | 8/2002 | Yamaoka | 361/704 |
| 2004/0173901 | A1 * | 9/2004 | Mallik et al. | 257/738 |
| 2005/0046039 | A1 * | 3/2005 | Yang et al. | 257/778 |
| 2005/0224955 | A1 * | 10/2005 | Desai et al. | 257/706 |
| 2006/0027921 | A1 * | 2/2006 | Chiu et al. | 257/738 |
| 2006/0042825 | A1 * | 3/2006 | Lu et al. | 174/252 |

* cited by examiner

*Primary Examiner*—Alexander O Williams
(74) *Attorney, Agent, or Firm*—Park, Vaughan & Fleming LLP

(57) ABSTRACT

A chip package for a computer system includes a substrate having a first region and a second region on a first surface, at least one die coupled to the first region on the first surface of the substrate and a main logic board coupled to the second region on the first surface of the substrate. By coupling the die and the main logic board on the first surface of the substrate, an overall thickness of the chip package is reduced.

15 Claims, 4 Drawing Sheets

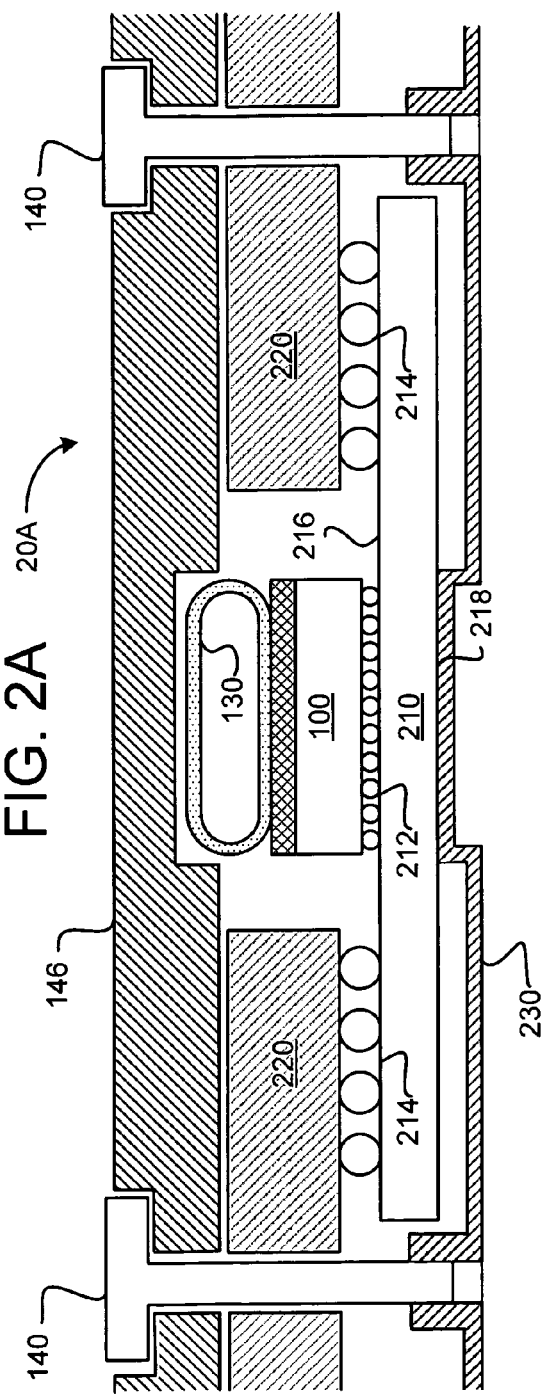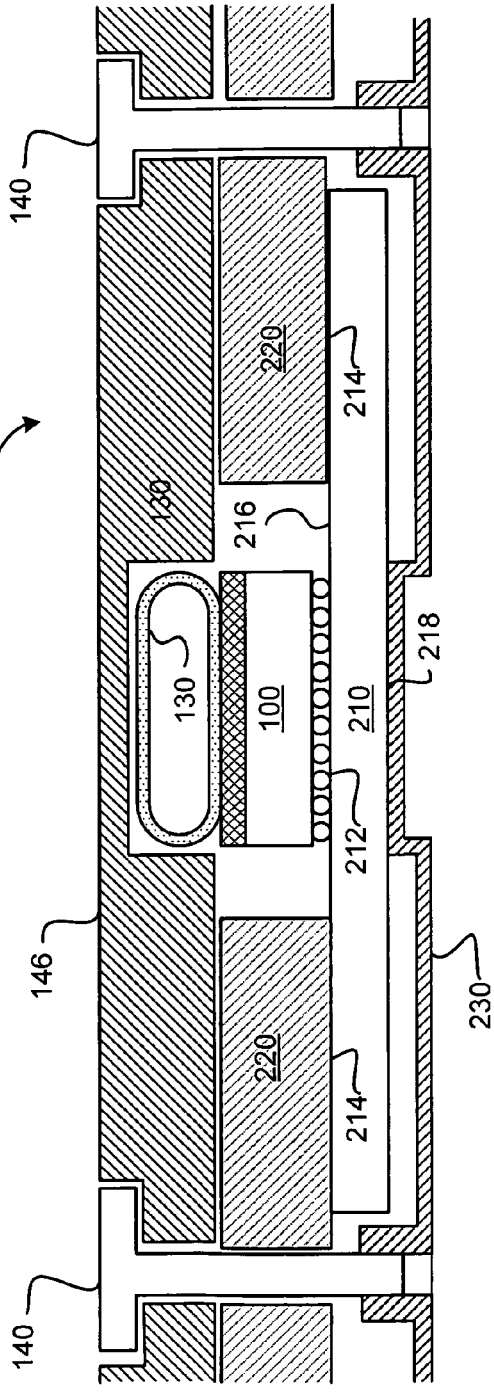

MID-PLANE ARRANGEMENT FOR COMPONENTS IN A COMPUTER SYSTEM

FIELD OF THE INVENTION

The present invention relates to an improved mid-plane arrangement for chips in a computer system for reducing mid-plane thickness.

BACKGROUND OF THE INVENTION

Typically a computer chip package in a mid-plane includes a substrate sandwiched between a die, which houses a central processing unit (CPU) or other ASIC chip, and a main logic board, such as a printed circuit board (PCB). Layering the substrate between the die and main logic board allows a manufacturer to use less expensive materials to form the main logic board, thereby saving costs.

The overall thickness of the die/substrate/PCB package is known as the package's "Z dimension," which refers to the height of the package along the "z-axis" perpendicular to the x-y plane. In a typical arrangement, the die is approximately 0.9 mm in thickness, the substrate is approximately 1.2 mm thick, and the PCB is approximately 1.2 mm in thickness. In addition, at least one ball grid array (BGA) is provided within the package that facilitates coupling and communication between the die and substrate and, in some instances, between the substrate and main logic board. Accordingly, the Z dimension of the package and PCB is typically between about 3.3 mm (LGA) and 4.2 mm (BGA).

As computer devices become smaller and thinner, the need to minimize the Z dimension of the chip package becomes more important. Accordingly, a need exists for an improved mid-plane chip package design and/or arrangement that reduces the Z dimension of the chip package.

BRIEF SUMMARY OF THE INVENTION

The present invention provides a chip package for a computer system. In a first aspect, the chip package includes a substrate having a first region and a second region on a first surface, at least one die coupled to the first region on the first surface of the substrate and a main logic board coupled to the second region on the first surface of the substrate. By coupling the die and the main logic board on the first surface of the substrate, an overall thickness of the chip package is reduced.

In a second aspect, a cooling system for the chip package according to the first aspect includes a heat dissipation system in thermal contact with a first side of the at least one die, wherein the first side of the die opposes a second side that is coupled to the first region on the first surface of the substrate and a plate member coupled to the substrate on a second surface opposing the first surface of the substrate. The plate member comprises a thermal conductive material and is in thermal contact with the second surface of the substrate in a region opposite to the first region on the first surface such that heat generated from at least one component in the at least one die flows in up into the heat dissipation system and down through the substrate and into the plate member. Thus, the component is cooled by the heat dissipation system and the plate member simultaneously.

According to aspects of the present invention, the die and the main logic board are coupled to the same surface of the substrate. Accordingly, the main logic board and the die share the same Z dimension. Because the die, substrate and main logic board are not stacked serially, the Z dimension is reduced to the thickness of the die and the thickness of the substrate only, thereby reducing the Z dimension by at least the thickness of the main logic board.

DESCRIPTION OF SEVERAL VIEWS OF THE DRAWINGS

FIG. 2A is a cross sectional view of a mid-plane chip package with fine and coarse ball grid arrays according to a version of the present invention.

FIG. 2B is a cross sectional view of a mid-plane chip package with a fine ball grid array and a land grid array according to a version of the present invention.

DETAILED DESCRIPTION OF THE INVENTION

The present invention relates to an improved arrangement for a chip package in a computer system for reducing mid-plane thickness. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1A:
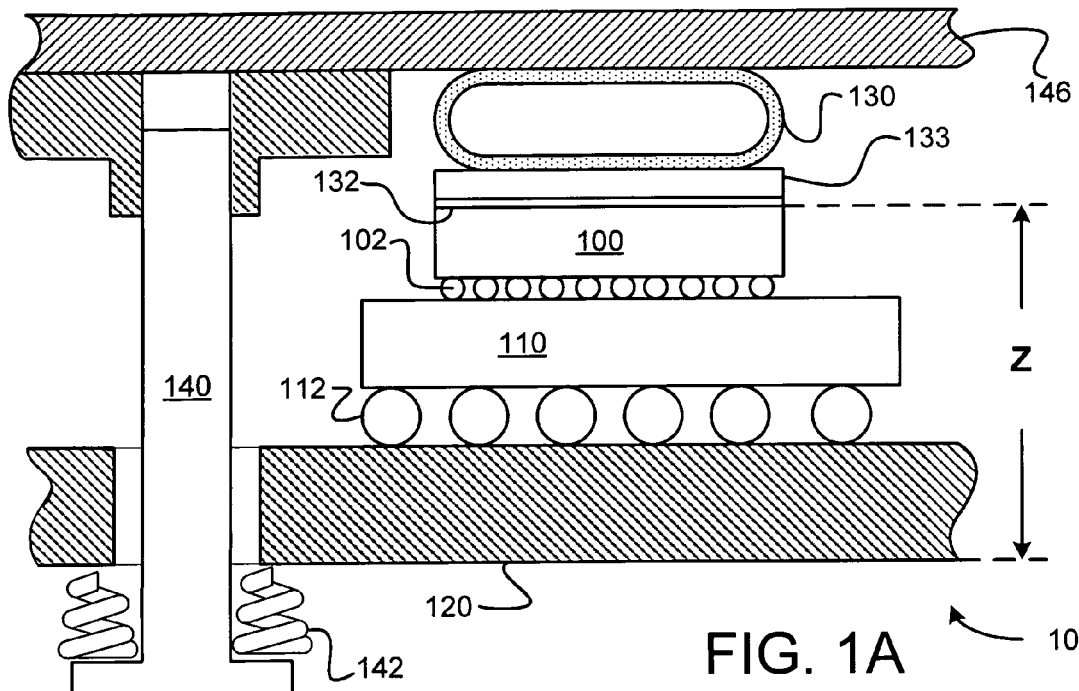
FIG. 1A is a cross sectional view of a conventional chip package with fine and coarse ball grid arrays.
Figure 1B:
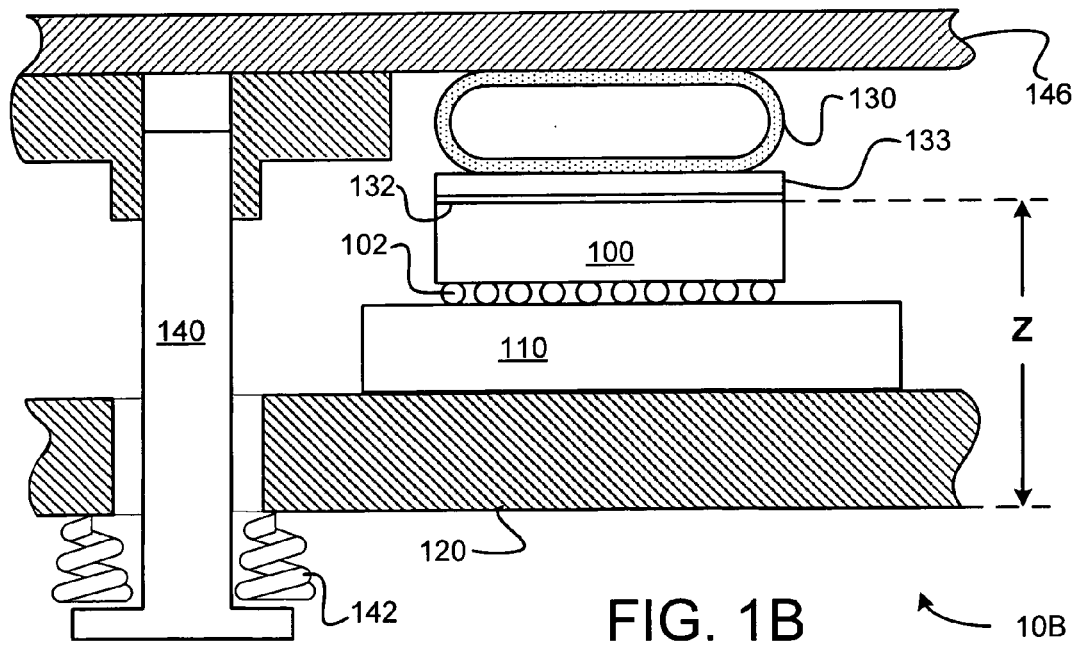
FIG. 1B is a cross sectional view of a conventional chip package with a fine ball grid array and a land grid array.

FIG. 1A and FIG. 1B are cross-sectional views of conventional surface mount chip packages. In FIG. 1A, the chip package 10A includes the die 100, the substrate 110 and the main logic board, e.g., a PCB 120, stacked serially one on top of the other. In FIG. 1A, a fine BGA 102 couples the die 100 to the substrate 110, and a coarse BGA 112 couples the substrate 110 to the PCB 120. In FIG. 1B, the substrate 110 is coupled to the PCB 120 via a land grid array (LGA).

The die 100 typically houses a CPU or some other heat generating component. To dissipate the heat, a heat dissipation system is used to cool the component. An exemplary heat dissipation system includes a heat pipe 130 and an external heat spreader 146. The heat pipe 130 is in thermal communication with a top surface of the die 100 via a thermal interface material 132 coupled to an intermediate heat spreader 133. The heat pipe 130 typically contains a cooling fluid that absorbs the heat generated by the CPU in the die 100 and dissipates the heat to the environment. The heat pipe 130 can be in thermal communication with the external thermal spreader 146, which provides additional heat dissipation.

The chip package 10A, 10B is secured to the heat pipe 130 by coupling the PCB 120 to the external heat spreader 146 via a plurality of fasteners 140, such as a screw. In order to secure the chip package 10 without damaging the fine BGA 102 and coarse BGA 112, at least one preloaded spring mechanism 142 is provided between the PCB 120 and fasteners to control the compression force applied by the fasteners 140.

The thickness, Z, of the chip package 10 is typically measured from the top of the die 100 to the bottom of the PCB 120. Accordingly, the thickness, or Z dimension, is at least the summation of the thicknesses of the PCB 120, the substrate 110, and the die 100 and the height of the fine BGA 102.

As stated above, it is desirable to reduce the overall Z dimension of the chip package 10 in order to manufacture thinner devices and to allow for higher capacity heat removal systems. Thus, according to a preferred embodiment of the present invention, the die, the substrate and the PCB are reconfigured so that the Z dimension of the chip package is reduced significantly. In particular, the substrate is reconfigured to receive the die and the PCB on the same surface. In other words, the die and the PCB are coupled to the substrate on one side, instead of two opposing sides. In turn, the PCB is configured to provide an opening for the die so that the PCB surrounds the die. In this manner, the overall Z dimension of the chip package according to the present invention is reduced by at least the thickness of the PCB.

FIG. 2A and FIG. 2B are cross-sectional views of mid-plane chip packages 20A, 20B according to versions of the present invention where similar components are identified by the same item numerals. As is shown in FIG. 2A and FIG. 2B, the die 100 is coupled to a die region 212 of a substrate 210 via a fine BGA, and a PCB 220 is coupled to a PCB region 214 of the substrate 210. The die region 212 and the PCB region 214 of the substrate 210 are disposed on the same surface of the substrate 110, e.g., a top surface 216. In FIG. 2A, the PCB 220 is coupled to the PCB region 214 of the substrate 210 via a coarse BGA, while in FIG. 2B, the PCB 220 is coupled to the PCB region 214 of the substrate 210 via an LGA.

Figure 3:
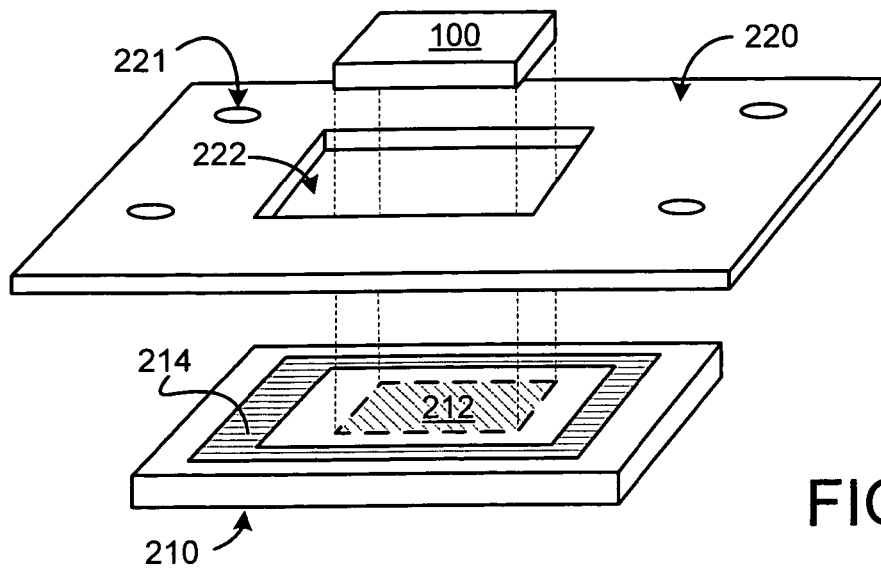
FIG. 3 is a perspective view of the chip package according to a version of the present invention.

FIG. 3 is a perspective view of the chip package 20A according to a version of the present invention. For the sake of simplicity, the fine BGA and coarse BGA are not shown. In a preferred embodiment, the PCB 220 includes a plurality of fastener holes 221 and at least one opening 222 through which the die 100 can fit. The substrate 210 includes at least one die region 212 and at least one PCB region 214 for receiving the die 100 and the PCB 220 respectively.

Figure 4A:
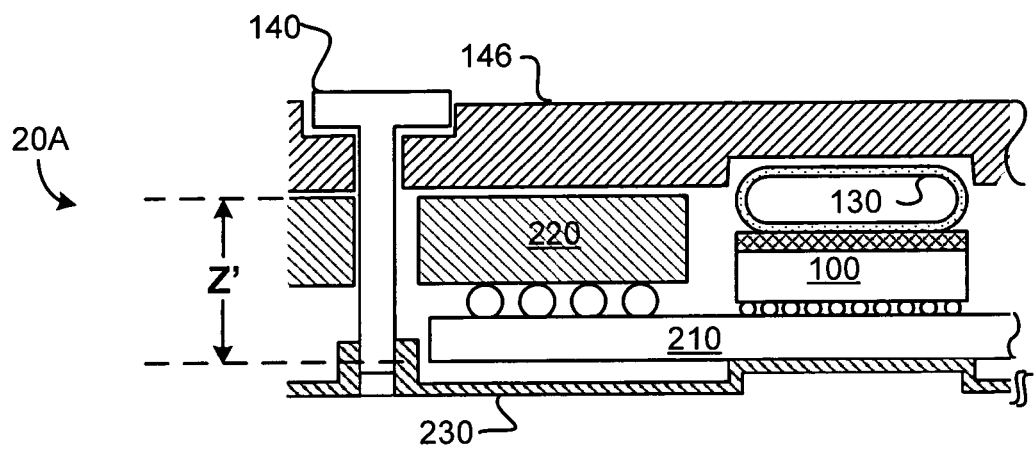
FIG. 4A and FIG. 4B are cross sectional views of a chip package according to versions of the present invention showing the Z dimension.
Figure 4B:
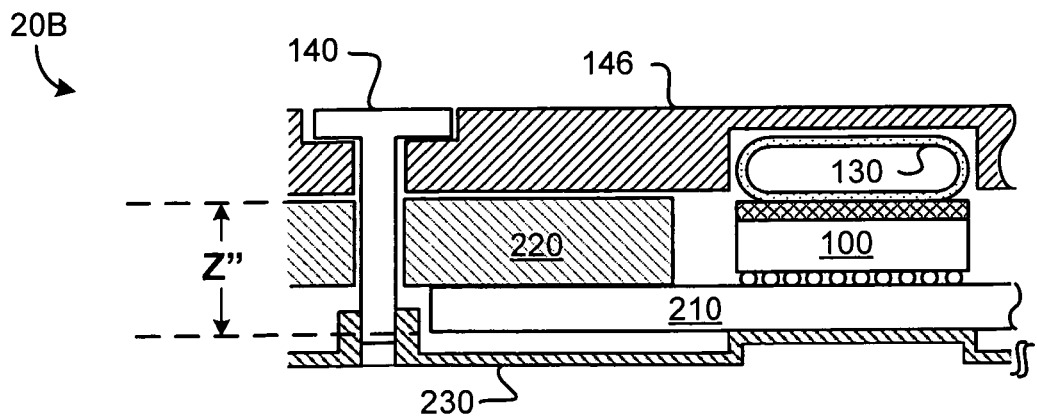

By reconfiguring the substrate 210 and the PCB 220 to allow the die 100 and the PCB 220 to be coupled to the same side of the substrate 210, the overall thickness of the die 100, substrate 210 and PCB 220, i.e., the Z dimension, is now only the thickness of the PCB 220, the thickness of the substrate 210 and the thickness of the BGA 112, if such is present. FIGS. 4A and 4B are cross-sectional views of the mid-plane chip packages showing the Z dimensions of each embodiment. Notably, the Z dimensions, Z' and Z", of the chip package 20A, 20B, respectively, are significantly reduced. In particular, the Z dimension is reduced by nearly the thickness of the die 100, which represents a reduction in thickness of at least 0.8 mm.

Figure 5:
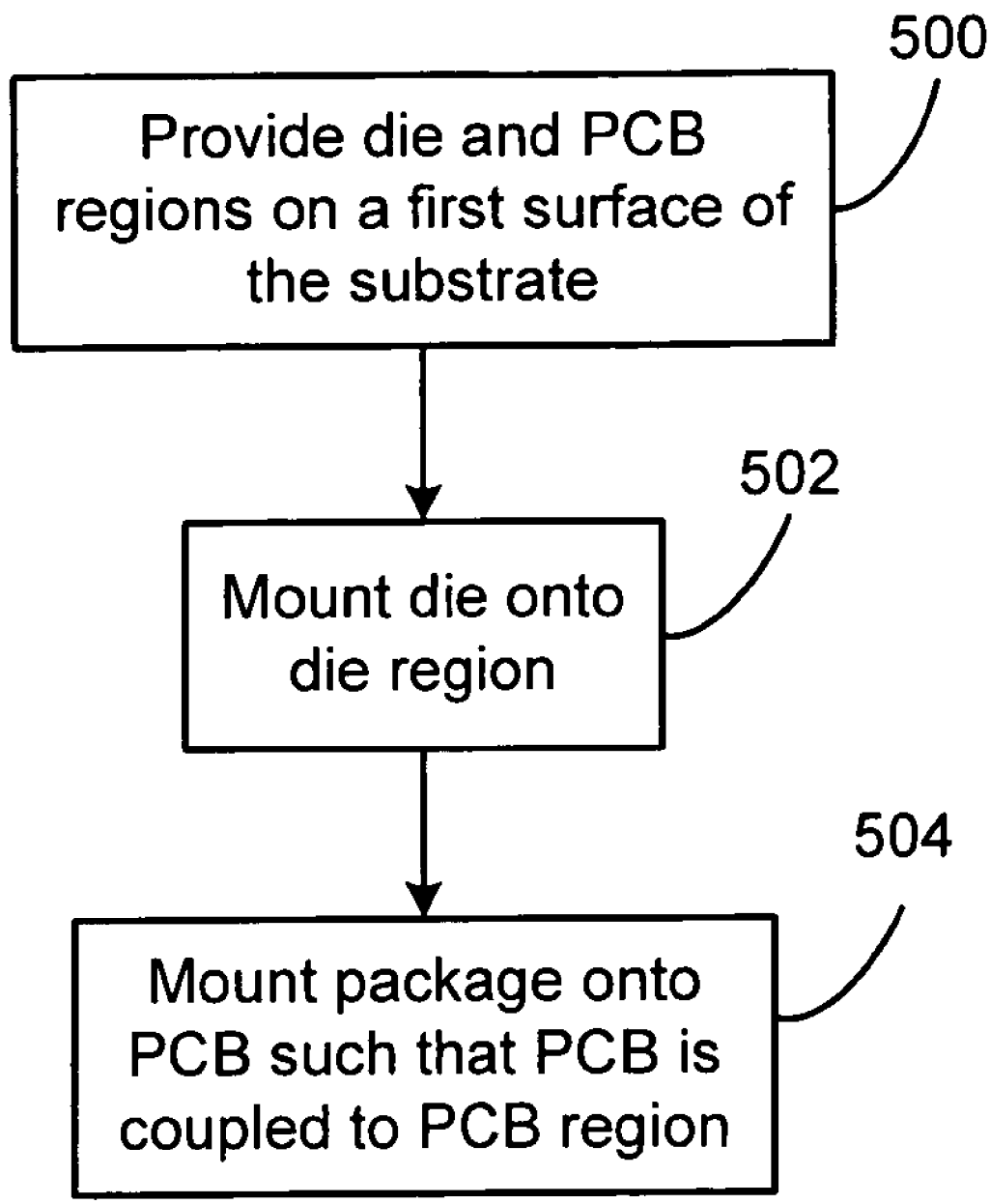
FIG. 5 is a flowchart illustrating a process for reducing the overall thickness of a chip package according to a version of the present invention.

FIG. 5 is a flowchart illustrating a process for reducing the overall thickness of a chip package according to a version of the present invention. The process begins by providing at least one die region 212 and at least one PCB region 214 in a first surface, e.g., the top surface 216, of the substrate 210 (step 500). The die 100 is then mounted onto the at least one die region 212 (step 502) and the substrate 210 is then mounted onto the PCB 220 such that the PCB 220 is coupled to the PCB region 214 of the substrate 210 (step 504).

Referring again to FIG. 2A, the chip package 20A is preferably secured to the heat pipe 130 and heat spreader 146 by a plate member 230 coupled to a bottom surface 218 of the substrate 210 opposing the top surface 216 on which the die 100 and PCB 220 are disposed. In one version, the plate member 230 acts as a preloaded spring member so that the fine BGA is not damaged. By mounting the plate member 230 onto the bottom surface 218 of the substrate 110, the coarse BGA is not loaded in tension, as would be the case in the configuration illustrated in FIG. 1A.

Moreover, in a preferred embodiment, the plate member 230 serves as an additional heat dissipater. By under-filling the fine BGA, e.g., injecting an epoxy resin between the substrate 210 and PCB 220, and selecting an appropriate substrate material, such as thermally conductive epoxy or other appropriate material, heat from the CPU in the die 100 can bleed through the substrate 210 to the plate member 230. In a preferred embodiment, the plate member 230 is manufactured from a conductive material, such as aluminum or copper, which dissipates the heat into the environment like a heat spreader. It has been observed that up to 30% of the heat generated by the CPU can be dissipated by the plate member 230. Thus, by utilizing the plate member 230 in accordance with the preferred embodiment of the present invention, heat can flow from top and bottom sides of the die 100 thereby increasing heat transfer efficiency. Moreover, with this added capacity, the size of the heat pipe 130 can be reduced without sacrificing heat transfer efficiency.

According to aspects of the present invention, the overall thickness of a chip package is significantly reduced by mounting the die and the PCB onto the same side of the substrate. In this arrangement, the PCB and die share the same Z dimension. In a further aspect of the present invention, a plate member that secures the chip package to a heat pipe and heat spreader above the die also serves as a backside heat spreader that improves heat transfer efficiency.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A chip package for a computer system, the chip package comprising:
    a substrate having a first region and a second region on a first surface;
    at least one die coupled to the first region on the first surface of the substrate; and
    a main logic board coupled to the second region on the first surface of the substrate; wherein the die and the main logic board are coupled to the same surface of the substrate; wherein the die and main logic board are positioned adjacent to each other via an enclosed opening in the main logic board through which the die can fit such that the main logic board surrounds the die and therefore occupies the same Z-dimension, instead of being stacked serially.

2. The chip package of claim 1 further comprising a fine ball grid array for coupling the at least one die to the first region on the first surface of the substrate.

3. The chip package of claim 2 further comprising a coarse ball grid array for coupling the main logic board to the second region on the first surface of the substrate.

4. The chip package of claim 1 further including a plate member coupled to the substrate on a second surface opposing the first surface of the substrate, the plate member for securing the chip package to a heat dissipation system.

5. The chip package of claim 4 wherein the plate member is a preloaded spring mechanism.

6. The chip package of claim 4 wherein the plate member comprises a thermal conductive material.

7. The chip package of claim 6 wherein the plate member is in thermal contact with the second surface of the substrate in a region opposite to the first region on the first surface such that heat generated from a component in the die flows through the substrate and is dissipated by the plate member.

8. A cooling system comprising:
   a chip package for a computer system wherein the chip package comprises a substrate having a first region and a second region on a first surface; at least one die coupled to the first region on the first surface of the substrate; and a main logic board coupled to the second region on the first surface of the substrate; wherein the die and the main logic board are coupled to the same surface of the substrate; wherein the die and main logic board are positioned adjacent to each other via an enclosed opening in the main logic board through which the die can fit such that the main logic board surrounds the die and therefore occupies the same Z-dimension, instead of being stacked serially;
   a heat dissipation system in thermal contact with a first side of the at least one die, wherein the first side of the die opposes a second side that is coupled to the first region on the first surface of the substrate; and
   a plate member coupled to the substrate on a second surface opposing the first surface of the substrate, the plate member for securing the chip package to the heat dissipation system, wherein the plate member comprises a thermal conductive material,
   wherein the plate member is in thermal contact with the second surface of the substrate in a region opposite to the first region on the first surface such that heat generated from at least one component in the at least one die flows in a first direction into the heat dissipation system and in a second direction opposite to the first direction through the substrate and into the plate member such that the component is cooled by the heat dissipation system and the plate member simultaneously.

9. The cooling system of claim 8, wherein the heat dissipation system includes a heat pipe coupled to the first side of the at least one die via a thermal interface material; wherein the heat pipe may be in thermal communication with an external heat spreader which provides additional heat dissipation.

10. The cooling system of claim 8 wherein the plate member comprises either aluminum or copper.

11. The cooling system of claim 8 wherein the substrate comprises thermally conductive epoxy.

12. A chip package for a computer system, the chip package comprising:
    a substrate having a first region and a second region on a first surface;
    at least one die coupled to the first region on the first surface of the substrate; and
    a main logic board coupled to the second region on the first surface of the substrate, wherein the main logic board includes at least one opening through which the at least one die passes,
    wherein the die and the main logic board are coupled to the same surface of the substrate; wherein the die and main logic board are positioned adjacent to each other via an enclosed opening in the main logic board through which the die can fit such that the main logic board surrounds the die and therefore occupies the same Z-dimension, instead of being stacked serially.

13. A method for reducing an overall thickness of a chip package, the method comprising:
    providing a substrate having a first region and a second region on a first surface;
    mounting at least one die to the first region on the first surface of the substrate; and
    mounting the substrate onto a main logic board such that the main logic board is coupled to the second region on the first surface of the substrate,
    wherein by mounting the die and the main logic board on a same surface of the substrate, the dies and the main logic board are positioned adjacent to each other via an enclosed opening in the main logic board through which the die can fit such that the main logic board surrounds the die and therefore occupies the same Z-dimension, instead of being stacked serially.

14. The chip package of claim 9, wherein the external heat spreader has a recessed area that encloses the heat pipe such that both the external heat spreader and the heat pipe are positioned adjacent to each other and therefore occupy the same Z-dimension, instead of being stacked serially.

15. The chip package of claim 1, further including an external member disposed on the opposite side of the substrate relative to the main logic board, the external member having a recessed area that that receives a die stack up.

* * * * *

UNITED STATES PATENT AND TRADEMARK OFFICE
CERTIFICATE OF CORRECTION

| | | |
|---|---|---|
| PATENT NO. | : 7,714,423 B2 | Page 1 of 1 |
| APPLICATION NO. | : 11/239879 | |
| DATED | : May 11, 2010 | |
| INVENTOR(S) | : Gavin Reid et al. | |

It is certified that error appears in the above-identified patent and that said Letters Patent is hereby corrected as shown below:

In column 6, line 45, in Claim 15, delete "that that" and insert -- that --, therefor.

Signed and Sealed this
Eighth Day of November, 2011

David J. Kappos
*Director of the United States Patent and Trademark Office*